United States Patent [19]

Hill et al.

[11] Patent Number: 5,192,911
[45] Date of Patent: Mar. 9, 1993

[54] NMR PROBE INCORPORATING RF SHIELDING OF SAMPLE

[75] Inventors: Howard D. W. Hill, Cupertino; Michael D. Cummings, Sunnyvale, both of Calif.

[73] Assignee: Varian Associates, Inc., Palo Alto, Calif.

[21] Appl. No.: 741,720

[22] Filed: Aug. 7, 1991

[51] Int. Cl.[5] .......................................... G01R 33/20
[52] U.S. Cl. .................................................... 324/322
[58] Field of Search .............. 324/300, 307, 309, 318, 324/322; 128/653.5; 335/301

[56] References Cited

U.S. PATENT DOCUMENTS

| | | | |
|---|---|---|---|
| 4,748,412 | 5/1988 | Yamamoto | 324/318 |
| 4,851,780 | 7/1989 | Dejon | 324/322 |
| 4,929,881 | 5/1990 | Yabusaki | 324/318 |
| 5,038,129 | 8/1991 | Oae et al. | 335/301 |
| 5,132,618 | 7/1992 | Sagimoto | 324/318 |

Primary Examiner—Michael J. Tokar
Attorney, Agent, or Firm—Edward H. Berkowitz

[57] ABSTRACT

Parasitic excitation of an NMR sample is minimized by providing shielding of the sample against RF pick-up from coil leads or like proximate conductive structure in the interior region of the RF coil.

5 Claims, 4 Drawing Sheets

NMR PROBE INCORPORATING RF SHIELDING OF SAMPLE

FIELD OF THE INVENTION

The invention is in the field of nuclear magnetic resonance apparatus and particularly relates to improvements in RF probe structure.

BACKGROUND OF THE INVENTION

In studies of high resolution NMR phenomena one limiting characteristic is the signal-to-noise ratio. The noise has a diverse origin and includes sources other than simple stochastic contributions. It is known that leads of the RF coil may serve as sources of parasitic radiation which may affect a sample under investigation. The present work is predicated upon improvements to RF probe performance incident to incorporating structure having the effect of eliminating, in the sensitive volume of the apparatus, RF signal pick-up originating from coil leads and otherwise shielding the sample from discontinuities of the termination of the coil itself (end effects).

The polarizing field of the NMR apparatus is carefully shimmed to provide for the highest achievable uniformity in the central region of the RF coil where the coil design provides for application of the desired irradiation. The sample is ordinarily of extended dimension along one axis to avoid discontinuity in this sensitive volume, but sample regions removed from the center region of the sensitive volume may experience a significantly different polarizing field and therefore resonate at a different frequency. Steps taken to suppress solvent excitation in the center region of the sensitive volume may be ineffective against spurious excitation from coil leads near the ends of the sample. A broad resonance, shifted from the solvent peak can result, masking relatively weak intensity spectral features in this region.

In prior art, an appreciation of the possibility of parasitic excitation arising from radiation from coil leads was discussed in U.S. Pat. No. 4,851,780. A structure was there described comprising symmetrical excited coil portions with the null point of the coil assembly furnishing a virtual ground for a shield plate disposed between the coil and that portion of the coil leads proximate the coil.

The effect of parasitic RF irradiation from coil leads is especially important in such situations where solvent suppression is required to observe spectral lines close to solvent resonances. With low sample concentration, e.g., $10^{-3}$ the solvent line(s) are inherently about $10^6$ times as intense the lines under study. Measures taken for suppression of a solvent resonance assume that such measures (saturation, for example) are ideally achieved. Where the sample has physical extension in regions beyond the sensitive volume and close to coil leads, even very weak radiation of the solvent (in the end portion) of the sensitive volume is sufficient to produce an undesired signal contribution.

The problem is exacerbated in certain composite probe structures. It is not uncommon for two coils to be coaxially disposed with the sample occupying a capillary along the common axis. One example of such structure is the use of quadrature coils. In another common arrangement an inner coil may be provided for $^{13}C$ irradiation and the outer coil provided for proton irradiation. Even in the case where such a probe is in use exclusively for proton resonance measurements and the inner coil is nominally inert, the presence of the inner coil leads, close to a portion of the sample (even though far from the center of the sensitive volume) provides a means for re-radiating the proton irradiation on the remote sample portion.

In the present invention shielding of the sample of coil leads is accomplished with shielding comprising a floating conductive guard cylinder and/or an end cover or disk.

Use of a floating guard ring, coaxially disposed inside of a slotted resonator is described in U.S. Ser. No. 07/681,218. This structure was understood to provide capacitive couplings between resonator portions separated by slots, or simply to provide a virtual ground in symmetric geometrical and electrical relationship to an outer ring structure.

Detailed Description of the Present Invention

Figure 1:
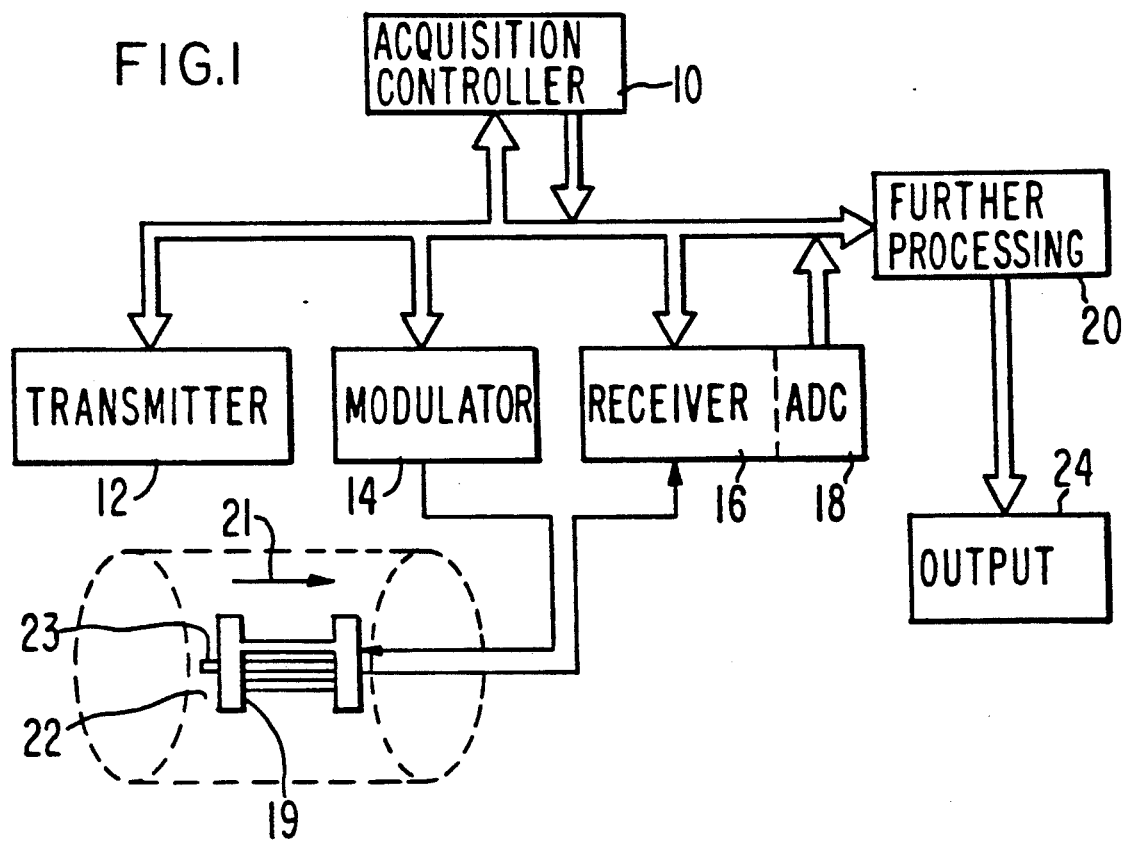
FIG. 1 illustrates the context of the invention.

Portions of a typical NMR data acquisition instrument are schematically illustrated in FIG. 1. An acquisition/control processor 10 communicates with an RF transmitter 12, modulator 14 and receiver 16, including analog-to-digital convertor 18 and a further digital processor 20. The modulated RF power irradiates an object 23 in a magnetic field 21 through a probe assembly 22 and response of the object is intercepted by probe 22 communicating with receiver 16. The response typically takes the form of a transient time domain waveform or free induction decay. This transient waveform is sampled at regular intervals and samples are digitized in adc 18. The digitized time domain wave form is then subject to further processing in processor 20. The nature of such processing may include averaging the time domain waveform over a number of similar of such waveforms and transformation of the average time domain wave form to the frequency domain yields a spectral distribution function directed to output device 24. Alternatively this procedure may thus be repeated with variation of some other parameter and the transformation(s) from the data set may take on any of a number of identities for display or further analysis.

The magnetic field 21 which polarizes the sample and defines the Larmor frequency thereof, is established by an appropriate means, not shown. Saddle coil(s) 19 are employed for imposing a desired spacial and time dependence of magnetic field.

Figure 2A:
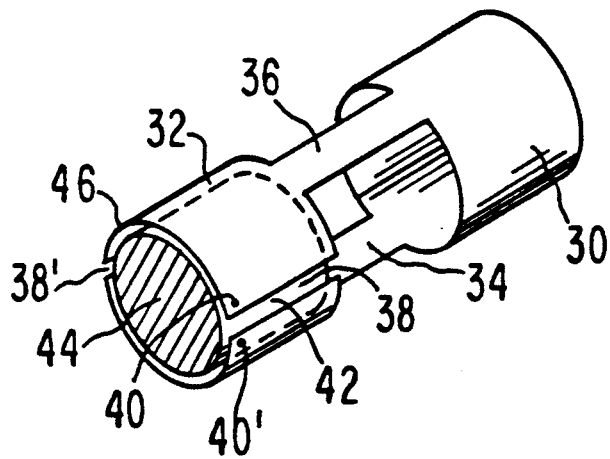
FIG. 2(a) shows one embodiment of the invention.

Turning now to FIG. 2A, there is shown a single turn saddle coil incorporating the invention. A particular coil structure comprises a ring 30 and ring 32, the latter segmented by gaps 38 and 38'. Rings 30 and 32 are connected by paraxial conductors 34 and 36. Leads 40 and 40' provide the feed from an RF source, e.g. transmitter 12 modulator 14. To this structure there is added a floating inner ring 42, closed off by closure disk 44 proximate to the leads 40 and 40'. A sample tube disposed on the axis of the coil is therefore shielded from parasitic radiation from leads 40 and 40' and from the edge effects of the end 46 of ring 32 of the coil.

Mechanical support (not shown) for the saddle coil of FIG. 2a may be provided by an insulating cylindrical tube or a plurality of small diameter rods as described in U.S. Pat. No. 4,517,516. The floating ring is preferably supported directly from the interior of ring 32, or independently supported.

Figure 2B:
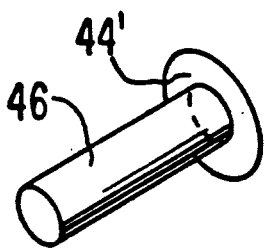
FIG. 2(b) shows one variation for controlled temperature measurements.

In a number of measurements, temperature control of the sample is accomplished by flow of a controlled temperature gas stream about the sample. Complete closure of the floating ring 42 with disk 44 would prevent or reduce passage of the gas stream in the portion of the sample adjacent the floating ring 42. Accordingly, the disk 44 may be provided with perforations or the closure may employ a mesh material. At the price of slight degradation of the RF shielding properties of disk 44, the benefit of temperature control of the entire sample is retained. Alternatively, a chimney 45 may be adapted to provide gas flow through closure disk 44' as in FIG. 2(b). The chimney 45 serves to provide the required shielding of the sample from RF leads. In still another alternative, the axial extension of ring 42 may extend beyond the termination of ring 32 by an amount sufficient to assure acceptable shielding.

Figure 3A:
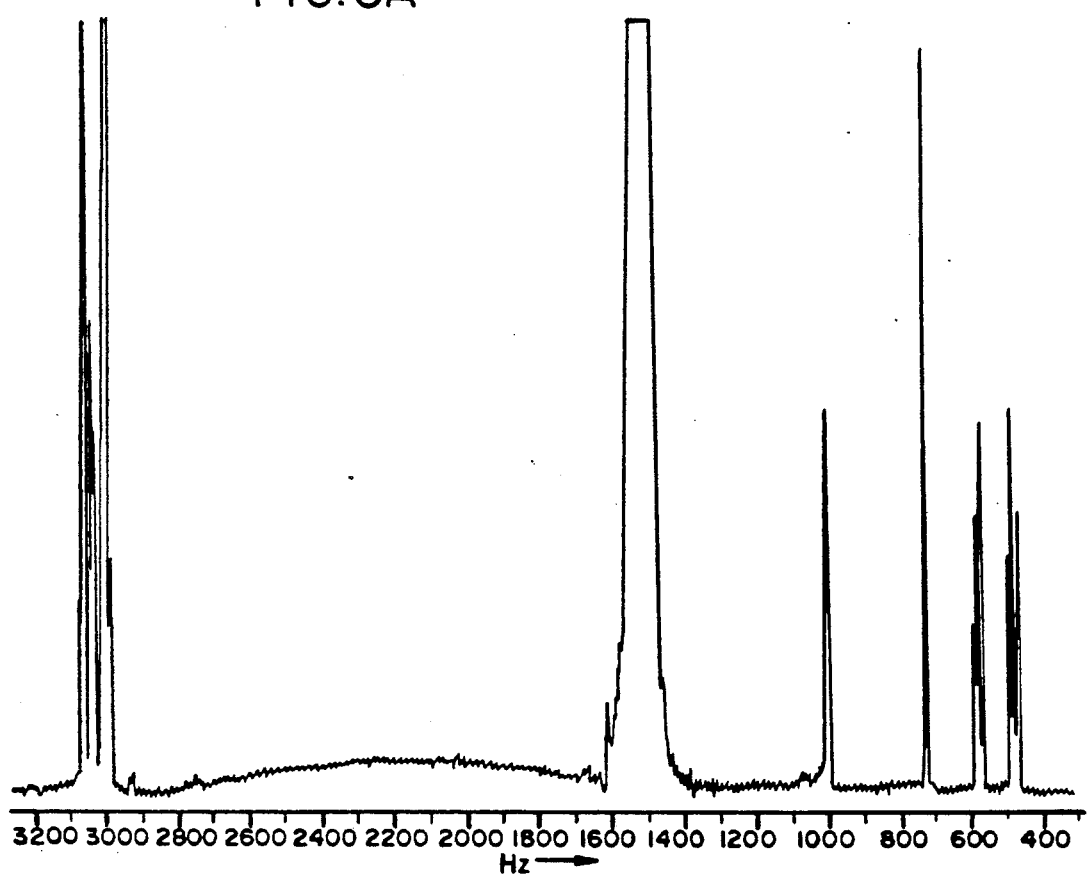
FIG. 3a shows an example spectrum obtained without full benefit of the embodiment of FIG. 2.
Figure 3B:
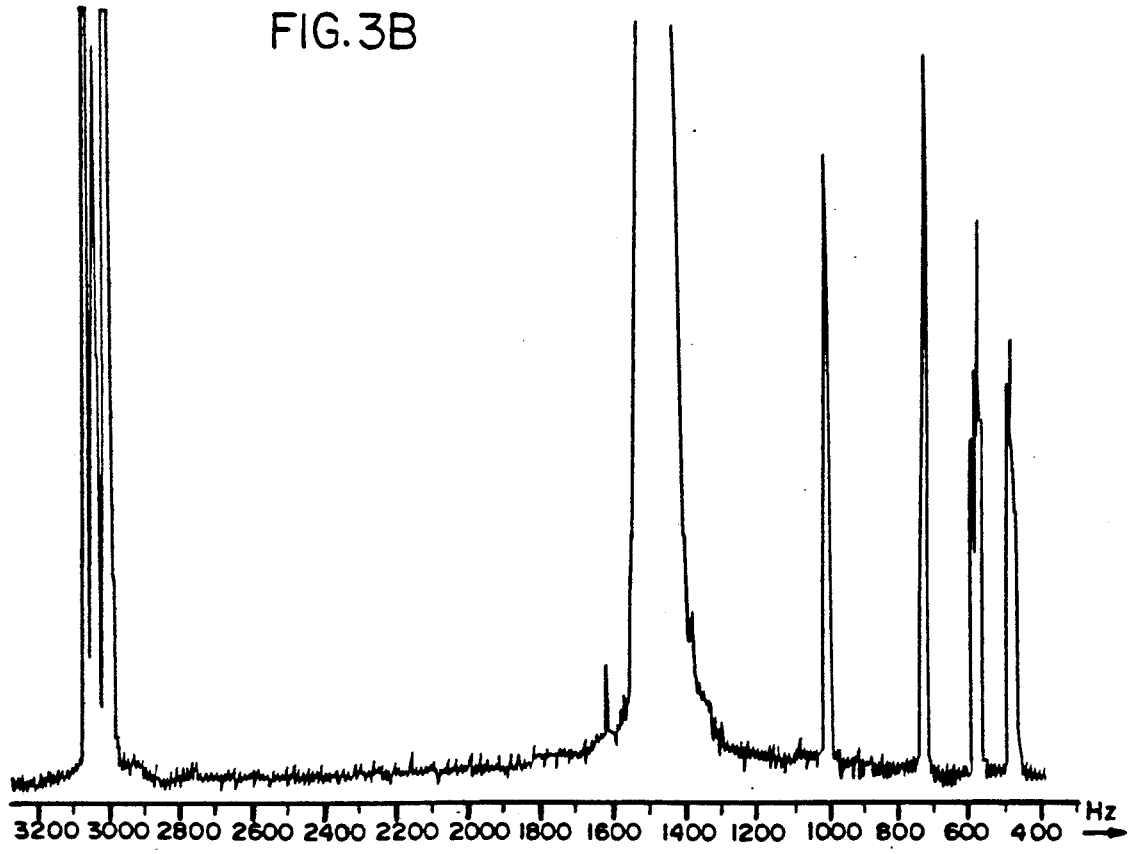
FIG. 3b shows the same example spectrum obtained with the FIG. 2 embodiment.

The effect of the closure of the floating ring 42 with disk 44 is illustrated in FIG. 3a (without closure disk 44) and FIG. 3b (with closure disk 44) for a sample of phenylalanine in 90% $H_2O$-10% $D_2O$. Closure disk 44 contained perforations for temperature control as discussed above. The spectral response of the instrument in the region close to the solvent peak and particularly from 1700 to 2700 mHz is particularly illustrative of the effect of the shielding.

Figure 4:
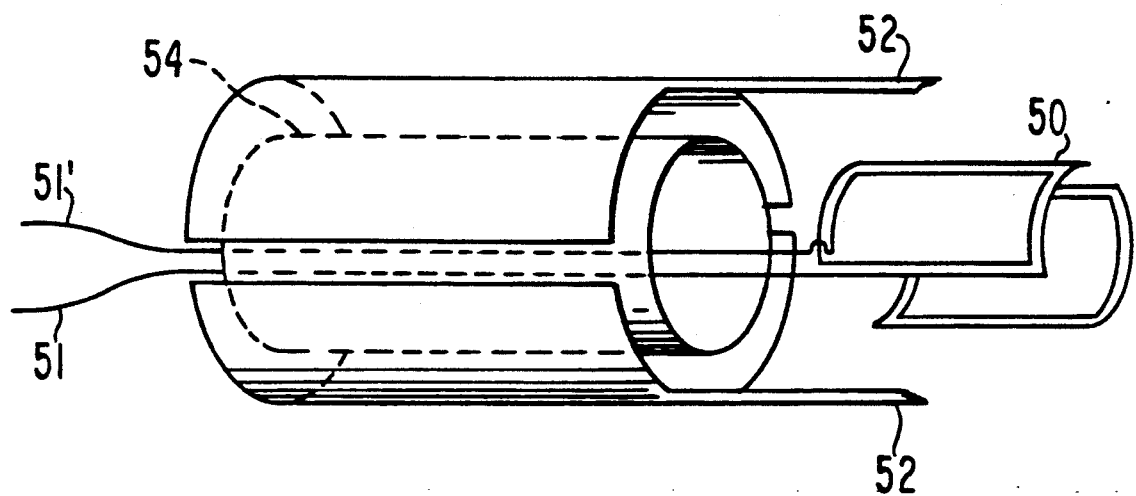
FIG. 4 illustrates another embodiment of the invention.
Figure 5A:
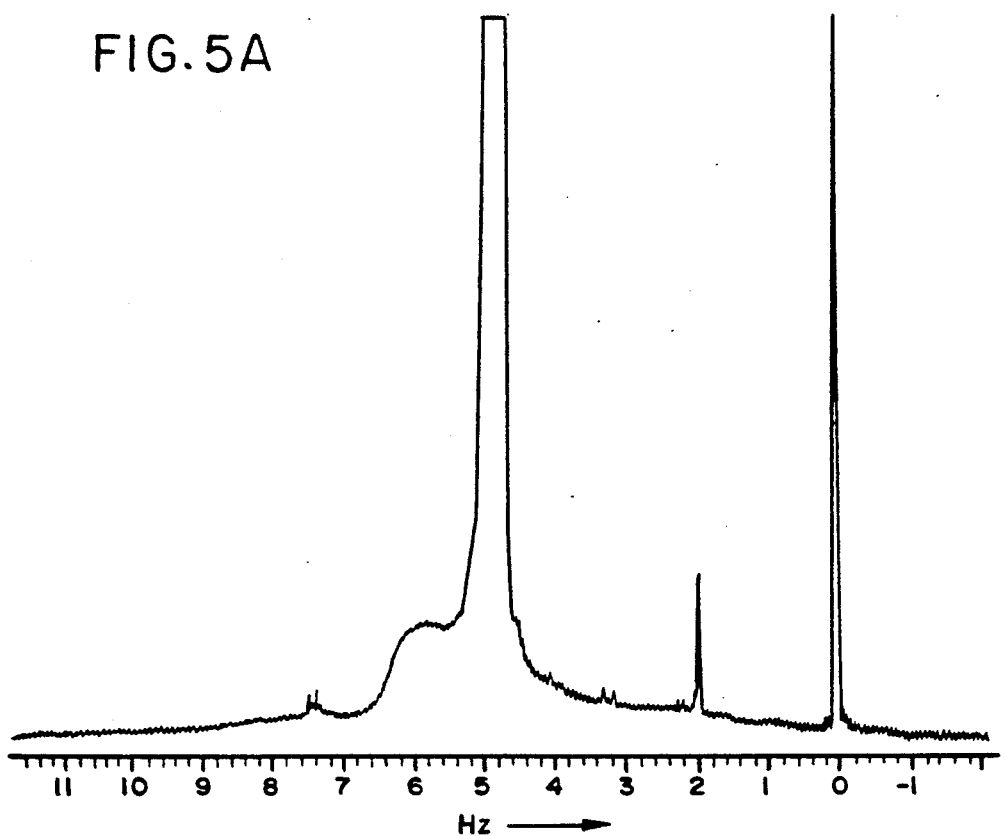
FIG. 5a shows spectra obtained with a two channel probe of prior art.
Figure 5B:
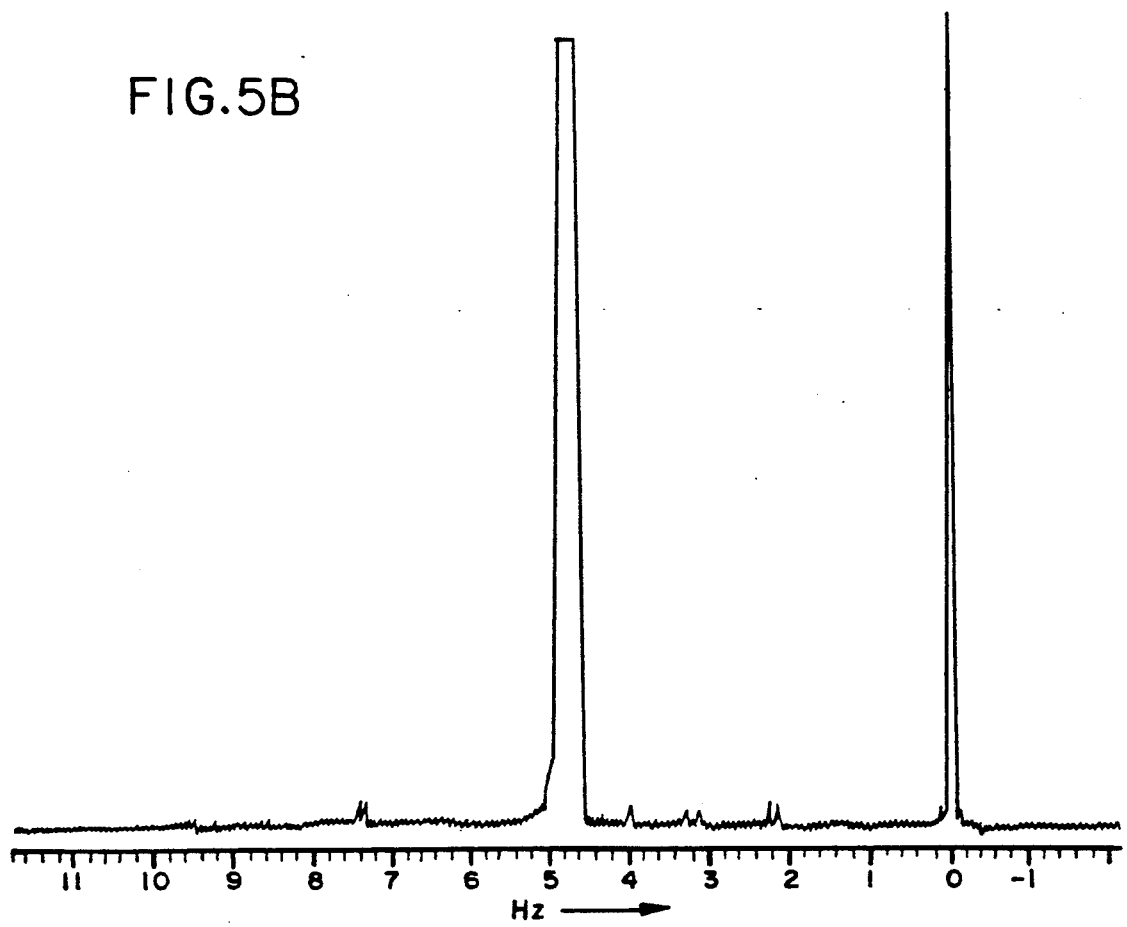
FIG. 5b shows spectra obtained with the two channel prior art probe with the improvement of the present invention.

Shielding of the sample from parasitic radiation may occur in other contexts as well. Consider typical composite coil structures comprising quadrature coils or coaxial coils. In one common (coaxial) arrangement shown in FIG. 4 an inner coil 50 is employed for $^{13}C$ excitation and the outer coil 52 for $^1H$ excitation. The probe may be of a type in which, for example, the inner coil 50 may be completely idle while the outer coil 52 is active. Nevertheless, it has been found that the presence of the inner coil 50 (specifically, its leads) 51—51' provides a medium for re-radiation (of the proton radiation) on portions of the axially disposed sample (not shown) proximate the inner coil leads 51—51'. In this example, a (relatively) long floating shield 54 is mechanically supported directly on the exterior of the inner coil 50. FIG. 5(a) and FIG. 5(b) compare spectra of the identical sample in a dual (coaxial) coil structure without (FIG. 5(a)), and equipped with (FIG. 5(b)) the floating ring.

It is to be understood that many changes can be made in the specifically described embodiments without departing from the scope of the invention and that the invention is to be determined from the scope of the following claims without limitation of the specifically described embodiments.

What is claimed is:

1. An RF coil for applying an RF magnetic field to a sample disposed within said RF coil structure, comprising
   (a) RF saddle coil means,
   (b) lead means for connecting said RF saddle coil means with an RF source,
   (c) floating shield means disposed between said sample and said RF saddle coil means to shield a portion of said sample proximate said lead means from said lead means, said floating shield means comprising a hollow cylindrical shell and a closure disk forming a cap on said shell.

2. The RF coil of claim 1 wherein said sample has axial symmetry and said sample, said RF coil means and said floating shield means are disposed coaxially.

3. The RF coil of claim 1 wherein said closure disk comprises at least one aperture whereby controlled temperature flowing gas contacts a portion of said sample adjacent said closure disk.

4. The method of reducing parasitic resonance excitation of a sample portion surrounded by an NMR coil structure comprising,
   interposing an electrically or floating conductive member between said coil structure and said sample.

5. An RF coil for applying an RF magnetic field to a sample disposed within said RF coil structure, comprising
   (a) RF saddle coil means,
   (b) lead means for connecting said RF saddle coil means with an RF source,
   (c) floating shield means disposed between said sample and said RF saddle coil means to shield a portion of said sample proximate said lead means from said lead means, said floating shield means comprising a hollow cylindrical shell, said cylindrical shell having an axial length sufficient to extend beyond said RF saddle coil means.

* * * * *